United States Patent
Kemmoku

(10) Patent No.: US 7,257,453 B2
(45) Date of Patent: Aug. 14, 2007

(54) EXPOSURE METHOD AND APPARATUS

(75) Inventor: Hiromi Kemmoku, Kanuma (JP)

(73) Assignee: Canon Kabushiki Kaisha, Tokyo (JP)

( * ) Notice: Subject to any disclaimer, the term of this patent is extended or adjusted under 35 U.S.C. 154(b) by 197 days.

(21) Appl. No.: 11/244,280

(22) Filed: Oct. 6, 2005

(65) Prior Publication Data

US 2006/0077365 A1 Apr. 13, 2006

(30) Foreign Application Priority Data

Oct. 7, 2004 (JP) ............................. 2004-294700

(51) Int. Cl.
*G06F 19/00* (2006.01)
(52) U.S. Cl. .......................... 700/100; 700/121; 710/6; 718/102
(58) Field of Classification Search ............... 700/100, 700/121; 710/6; 713/502; 717/161; 718/102; 355/53
See application file for complete search history.

(56) References Cited

U.S. PATENT DOCUMENTS

| | | | | |
|---|---|---|---|---|
| 5,120,134 | A * | 6/1992 | Kosugi | ....................... 356/401 |
| 5,740,065 | A * | 4/1998 | Jang et al. | ..................... 716/1 |
| 6,563,565 | B2 * | 5/2003 | Nishi | ........................... 355/53 |
| 6,714,281 | B1 * | 3/2004 | Amano et al. | ................. 355/55 |
| 6,738,682 | B1 * | 5/2004 | Pasadyn | ..................... 700/100 |
| 7,127,311 | B2 | 10/2006 | Kermmoku | ................. 700/100 |
| 2001/0034563 | A1 * | 10/2001 | Matsumoto et al. | ........ 700/101 |
| 2003/0225474 | A1 * | 12/2003 | Mata et al. | .................. 700/121 |
| 2005/0102263 | A1 | 5/2005 | Kemmoku | ..................... 707/1 |

FOREIGN PATENT DOCUMENTS

JP 8-167562 6/1996

* cited by examiner

*Primary Examiner*—Leo Picard
*Assistant Examiner*—Sheela Rao
(74) *Attorney, Agent, or Firm*—Fitzpatrick, Cella, Harper & Scinto

(57) ABSTRACT

An apparatus for exposing a plurality of lots of substrates to light. The apparatus includes a designating unit for designating, on the basis of an exposure condition being related to two consecutive lots of the plurality of lots of substrates and being reserved in the apparatus, an exposure preparation process being related to the latter one of the two consecutive lots and going to be omitted. The apparatus further includes an estimating unit for estimating a process time to be saved by the omission of the exposure preparation process designated by the designating unit, and a generating unit for generating a sequence for the plurality of lots, on the basis of the estimation made by the estimating unit, so as to minimize a required process time.

13 Claims, 12 Drawing Sheets

FASTEST LOT IS "ABC"

| RECIPE C DATA | | 812 |
|---|---|---|
| TYPE OF MASK | R2 | |
| ILLUMINATION CONDITION | I2 | |
| LAYER INFORMATION | L2 | |
| RESERVATION STATE | | |

| RECIPE B DATA | | 811 |
|---|---|---|
| TYPE OF MASK | R2 | |
| ILLUMINATION CONDITION | I2 | |
| LAYER INFORMATION | L1 | |
| RESERVATION STATE | | |

| RECIPE A DATA | | 810 |
|---|---|---|
| TYPE OF MASK | R1 | |
| ILLUMINATION CONDITION | I1 | |
| LAYER INFORMATION | L1 | |
| EXECUTION STATE | | |

ORDER OF LOT PROCESSING ↓

FIG. 8D

EXPOSURE METHOD AND APPARATUS

This application claims priority from Japanese Patent Application No. 2004-249700 filed Oct. 7, 2004, which is hereby incorporated by reference herein.

FIELD OF THE INVENTION AND RELATED ART

This invention relates generally to exposure techniques for the manufacture of microdevices, such as semiconductor devices (e.g., ICs or LSIs), liquid crystal devices, CCDs, or thin-film magnetic heads, for example.

The process of manufacturing semiconductor devices, such as LSIs or VLSIs, includes the use of a projection exposure apparatus that projects a circuit pattern, formed on a mask, onto a substrate that is coated with a photosensitive material. As a feature of such a projection exposure apparatus, the exposure condition has to be changed in various ways in accordance with the type (product lot) of products to be supplied and processed by the projection exposure. For example, the exposure amount, related to projection of the mask circuit pattern onto the substrate and the positional information related to ground marks (alignment marks) prepared for accurate registration and superposition of a circuit pattern, to be projected, with a circuit pattern (ground pattern) already formed on the substrate, will be changed in accordance with the product lot.

To this end, the operator has to precisely determine the exposure condition (hereinafter, this also will be referred to as a "recipe") beforehand, and also, to set that recipe in a related production apparatus or apparatuses prior to the production of semiconductor devices.

In recent years, in many cases, semiconductor devices are produced by wide-variety-and-small-lot production, and so the product lot to be produced by a projection exposure apparatus is changed frequently. It is, therefore, desirable to provide a control technique for minimizing the loss of production in relation to changing the product lot.

As an example, there is what can be called a "batch processing technique". According to this batch processing method, the recipe for a certain product lot, which is going to be produced, is reserved in an exposure apparatus such that, upon completion of the production of one product lot, production of the subsequent "reserved" product lot is initiated. Another example is a method that ensures quick and accurate change of semiconductor device lots and enables emergent lot interruption (see, for example, Japanese Laid-Open Patent Application, Publication No. 08-167562).

However, following extreme miniaturization of the circuit pattern of semiconductor devices, further improvements in precision of projection exposure apparatuses are required. Currently, it is strictly required to stably maintain the highest processing precision, such as focus precision or alignment precision, for example. Here, the focus relates to registering the surface of a substrate (wafer) with the imaging plane (focus plane) of a reduction projection lens, and the alignment concerns registering a projected pattern with a pattern already formed on the substrate. In projection exposure apparatuses, in this connection, the operation is carried out while calibration of systemized structural components and measurement of a subject of measurement by these structural components is made prior to or in the middle of the product lot processing.

On the other hand, because of widening of the variety of the products, the kinds of reticles (or masks) have been increased. This necessitates that the production operation is carried out while changing masks frequently.

It is, therefore, very important to reduce the time necessary for preparing the production operation in relation to each product lot, such as replacement of materials such as masks, various calibrations, and various measurements, for example, to thereby improve the productivity of the exposure apparatus.

The present invention has been achieved against the background described above, and it is accordingly an object of the present invention to provide a technique effective to improve the productivity of an exposure apparatus.

More specifically, in accordance with an aspect of the present invention, there is provided an apparatus for exposing a plurality of lots of substrates to light, the apparatus comprising a designating unit for designating, on the basis of an exposure condition being related to two consecutive lots of the plurality of lots of substrates and being reserved in the apparatus, an exposure preparation processing being related to the latter one of the two consecutive lots and to be omitted, an estimating unit for estimating a process time to be saved by the omission of the exposure preparation process designated by the designating unit, and a generating unit for generating a sequence for the plurality of lots on the basis of the estimation made by the estimating unit, so as to minimize a required process time.

In accordance with another aspect of the present invention, there is provided a device manufacturing method, comprising steps of exposing a substrate to light by use of an apparatus as discussed above, developing the exposed substrate, and processing the developed substrate to produce a device.

In accordance with a further aspect of the present invention, there is provided a method of generating a sequence for a plurality of lots of substrates to be exposed, the method comprising steps of designating, on the basis of an exposure condition being related to two consecutive lots of the plurality of lots of substrates, an exposure preparation process being related to the latter one of the two consecutive lots and being to be omitted, estimating a process time to be saved by the omission of the exposure preparation process designated at the designating step, and generating a sequence for the plurality of lots on the basis of the estimation made in the estimating step, so as to minimize a required process time.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 8A-8D are schematic views, respectively, for explaining the procedure of lot optimization according to an embodiment of the present invention.

DESCRIPTION OF THE PREFERRED EMBODIMENTS

Preferred embodiments of the present invention will now be described with reference to the attached drawings.

Embodiment 1

Figure 1:
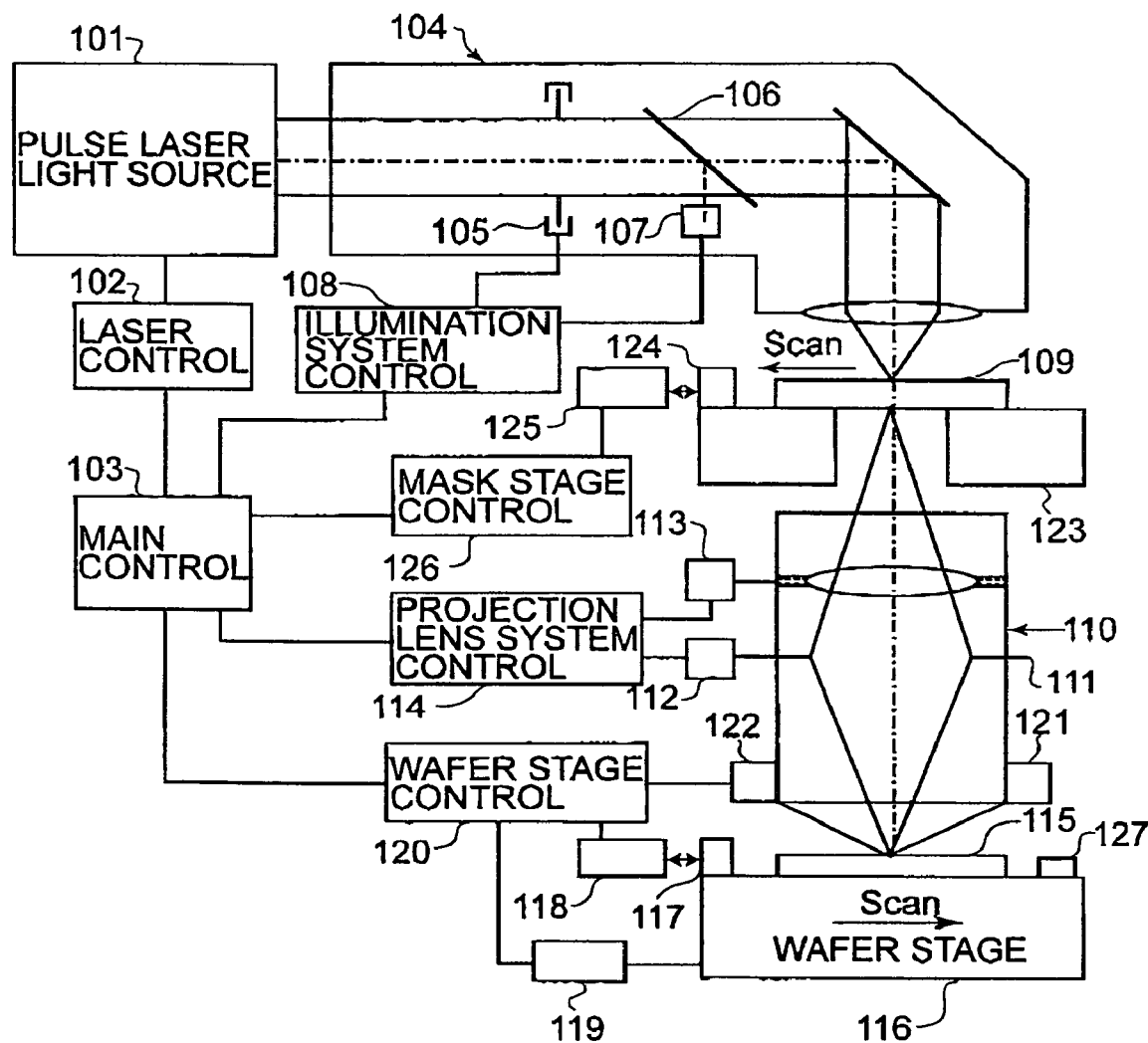
FIG. 1 is a schematic and diagrammatic view of a general structure of an exposure apparatus according to an embodiment of the present embodiment.

FIG. 1 is a schematic and diagrammatic view of a general structure of a step-and-scan type exposure apparatus according to an embodiment of the present invention. In FIG. 1, denoted at 101 is a pulse laser light source, which is tightly filled with a gas of KrF, for example, and which emits laser light. This light source provides light having a wavelength of 248 nm in the deep ultraviolet region.

The laser light source 101 has a front mirror that constitutes a resonator, and a band-narrowing module, such as a diffraction grating or a prism, for example, for band-narrowing this exposure wavelength. The laser light source 101 further includes a monitor module having a spectrometer or a detector, for example, for monitoring the wavelength stability and the spectral bandwidth, as well as a shutter, etc. Various control operations, such as control for wavelength stabilization or gas replacement operation of the laser light source, and control for discharging an applied voltage, for example, are carried out in a laser control device 102. In this embodiment, the laser control device 102 is communicated with a main control device 103 for the whole exposure apparatus through an interface cable. The laser light source 101 can be controlled in accordance with a command signal from the main control device 103.

A laser beam emitted from the pulse laser light source 101 is shaped into a predetermined beam configuration by means of a beam shaping optical system (not shown) of an illumination optical system 104. Subsequently, the light beam enters an optical integrator (not shown), by which a large number of secondary light sources, for illuminating a mask 103 (to be described later) with a uniform illuminance distribution, are produced. The illumination optical system 104 includes an aperture stop 105 having an opening of an approximately circular shape. The diameter of that opening and, last of all, the numerical aperture (NA) of the illumination optical system, can be adjusted to a desired value by use of an illumination system control device 108.

Here, the value of the ratio of the numerical aperture of the illumination optical system to the numerical aperture of a reduction projection lens 110 (to be described later) is a coherence factor (σ value). This means that the σ value can be adjusted by controlling the aperture stop 105 of the illumination system by means of the illumination system control device 108.

There is a half mirror 106 on the light path of the illumination optical system 104. A portion of exposure light that illuminates the mask 109 is reflected and extracted by this half mirror 106. There is an ultraviolet-light photosensor 107 disposed on the light path of reflection light from the half mirror 106, and this photosensor produces an output corresponding to the intensity of exposure light (i.e., exposure energy). The output of the photosensor 107 is converted into "exposure energy per pulse" by means of an integration circuit (not shown) for performing integration with respect to every pulse emission of the pulse laser light source 101. The exposure energy per pulse is then applied to the main control device 103 for controlling the main assembly of the exposure apparatus, through the illumination system control device 108.

The reticle (or mask) 109, which is an original, is formed with a circuit pattern for a semiconductor device, which pattern is to be projected onto a substrate. The circuit pattern of this mask is going to be illuminated by the illumination optical system 104. There is a variable blind (not shown) that includes light blocking plates, which are made movable in directions perpendicular to the optical axis so as to variably set an illumination region upon the circuit pattern surface of the mask 109.

Figure 2:
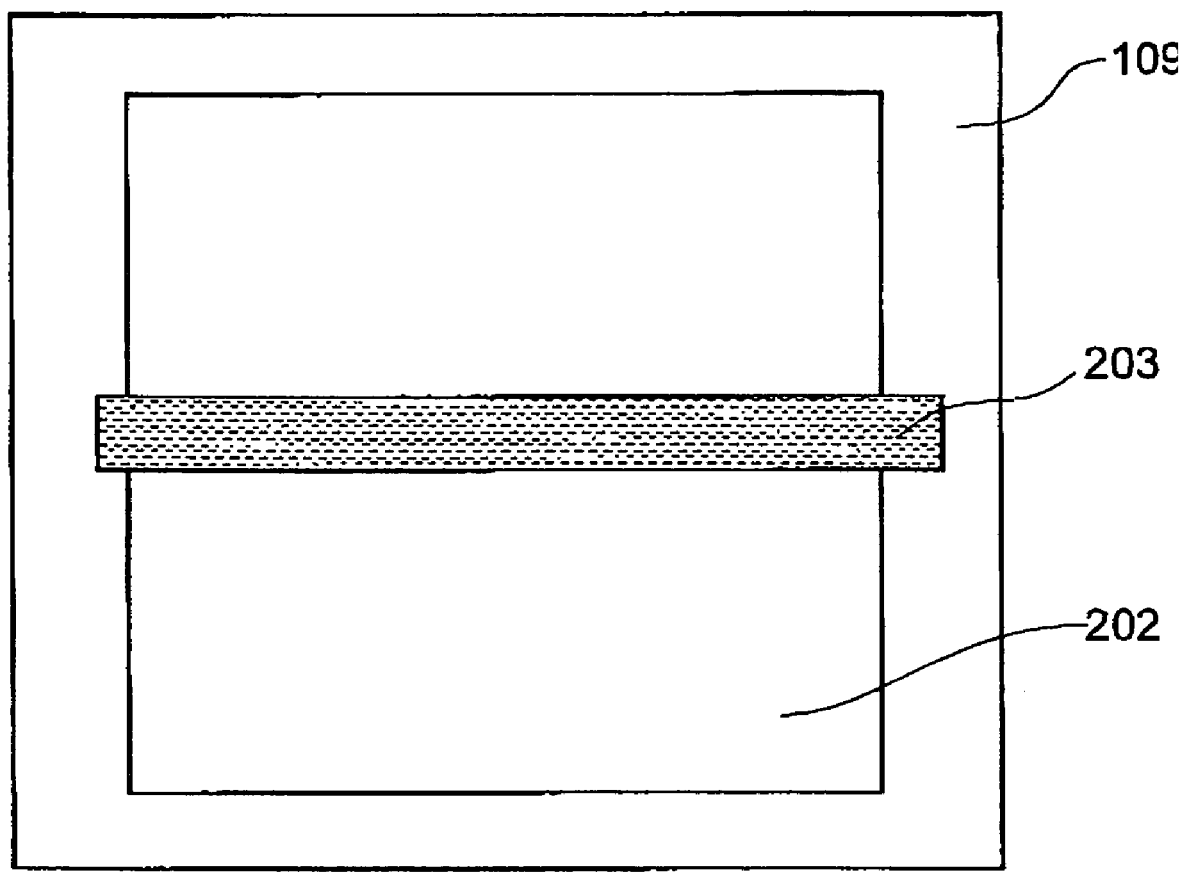
FIG. 2 is an enlarged view of a portion of the FIG. 1 embodiment.

FIG. 2 illustrates the mask 109, which is being illuminated. More specifically, a portion of the circuit pattern 202 of the mask 109 is being illuminated with a slit-like light beam 203. On the other hand, a portion of the circuit pattern 202 of the mask is projected onto a wafer 115, coated with a photoresist, in a reduced scale at a reduction magnification of β (β is ¼, for example). Here, the mask 109 and the wafer 115 are relatively, scanningly moved relative to the projection lens 110 and the slit-like light beam 203, in mutually opposite directions and at the speed ratio the same as the reduction magnification β. On the other hand, exposure with the pulse light from the pulse laser light source 101 is repeated. As a result of this, the circuit pattern 202 of the mask 109 is transferred to one region (corresponding to a single chip region or plural chip regions) on the wafer 110.

The projection lens 110 includes an aperture stop 111 having an opening of an approximately circular shape, which aperture stop is defined at a pupil plane of the projection lens 110 that corresponds to the Fourier transform surface with respect to the mask. The diameter of that opening can be adjusted to a desired value by means of driving means 112, such as a motor, for example. There is lens driving means 113, which is arranged to move one lens or more of the projection lens system 110 in the optical axis direction thereof, by using a pneumatic pressure or a piezoelectric device, for example. This is made to suppress degradation of aberrations of the projection lens 110 or to adjust the projection magnification or distortion aberration thereof.

There is a wafer stage 116, which is made movable in three-dimensional directions, that is, the optical axis direction (Z direction) of the projection lens 110, as well as directions orthogonal to this optical axis direction (i.e., directions parallel to the X-Y plane). The position of the wafer stage 116 with respect to the X-Y plane can be measured by measuring a movement distance of a movable mirror 117, which is fixed to the wafer stage 116, by using a laser interferometer 118. A stage control device 120, which is controlled by the main control device 103 of the exposure apparatus, can operate to detect the position of the wafer stage 116 in association with the laser interferometer 118. By controlling the driving means 119, such as a motor, for example, the stage control device 120 moves the wafer stage to a desired position with respect to the X-Y plane.

Denoted at 121 and 122 in FIG. 1 are components of surface position detecting means for the focusing. More specifically, a light projecting optical system 121 projects a plurality of light beams having a wavelength to which the photoresist material on the wafer 115 is not sensitive, and these light beams are converged upon the wafer 115, respectively. The light beams are reflected by the wafer 115 and they enter a light receiving optical system 122. While not shown in the drawing, the light receiving optical system 122 includes a plurality of position-detecting light receiving elements corresponding to the reflected light beams, respectively. Each position-detecting light receiving element has a light receiving surface, which is placed in an approximately optically conjugate relation with the reflection point of a corresponding light beam on the wafer 15 surface, with respect to an imaging optical system.

With this arrangement, any positional deviation of the wafer surface with respect to the optical axis direction of the projection lens 110 can be detected as a positional deviation of incident light upon the position-detecting light receiving elements of the light receiving optical system 122.

In this embodiment, the mask 109 and the wafer 115 are positioned and placed into a predetermined relation with each other. Thereafter, on the basis of a synchronization signal supplied from the main control device 103, the laser control device 126 and the wafer stage control device 120, as well as the mask stage control device 126, operate, respectively. These control devices cooperate with each other to perform the scan exposure for transferring the circuit pattern 202 of the mask 109 onto an exposure region (chip region) of the wafer 115. After this, the wafer stage 116 moves the wafer 115 along the X-Y plane by a predetermined amount. Then, a different region of the wafer 115 is exposed similarly. Thus, the embodiment is based on the step-and-scan method in which the stepwise motion and the scan exposure, such as described above, are repeated.

Figure 3:
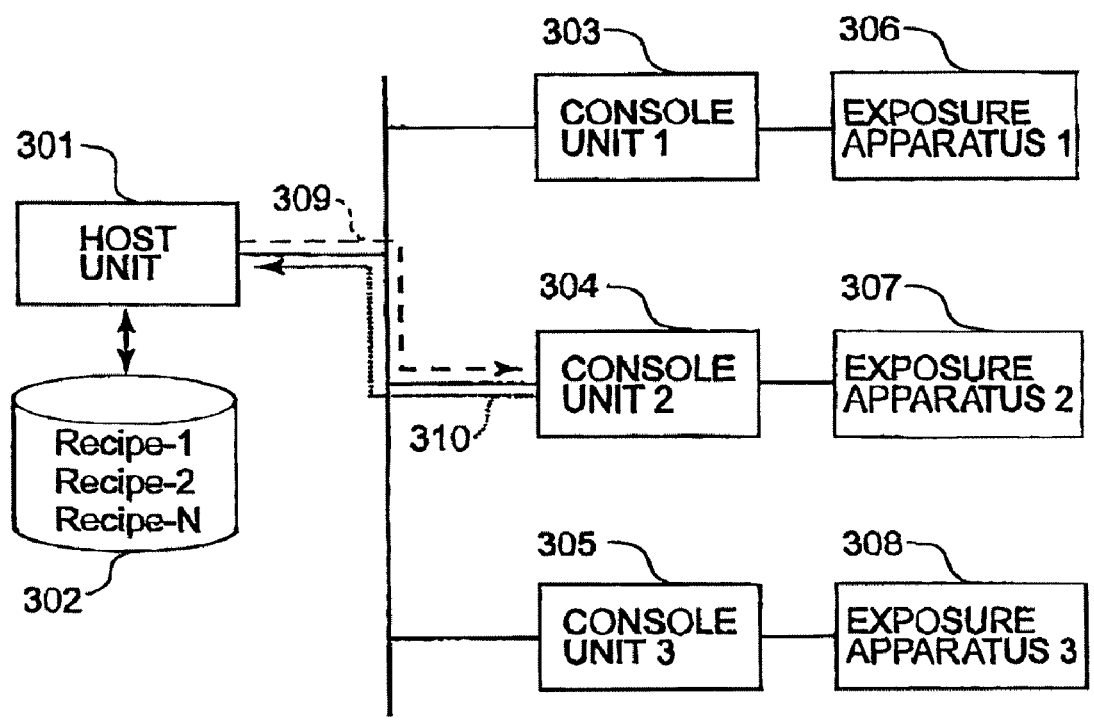
FIG. 3 is a schematic and diagrammatic view of a system structure for the production of semiconductor devices, wherein an exposure apparatus according to an embodiment of the present invention is used there.

FIG. 3 is a schematic and diagrammatic view of a system structure that includes step-and-scan type exposure apparatuses of the FIG. 1 embodiment, for the manufacture of semiconductor devices. Denoted in FIG. 3 at 301 is a superordinate host unit arranged to control a plurality of projection exposure apparatuses. Denoted at 302 is a hard disk drive coupled to the host unit 301, and a database, for example, for controlling the recipes in which exposure process conditions corresponding to the respective products are set in detail, is stored in the hard disk drive. Denoted at 306, 307 and 308 are exposure apparatuses each being such as described hereinbefore.

Denoted at 303, 304 and 305 are console units annexed to the exposure apparatuses 306-308, respectively. These console units 303-305 are connected to the exposure apparatuses 306-308 in one-on-one relation, respectively, so that the operator can operate these exposure apparatuses individually through corresponding console units 303-305, respectively. Furthermore, the host unit 301 is on-line connected to each exposure apparatus 306-308 by a network communication mechanism and through a corresponding one of the console units 303-305. With this arrangement, centralized control of the exposure apparatuses by the host unit 301 is enabled. This embodiment will be explained below with reference to the latter, that is, the on-line control of exposure apparatuses with the host unit 301.

An on-line communication channel 309 is a channel for a lot process command for the product (semiconductor device), which is transmitted from the host unit 301 to the respective console units 303-305, and it shows the flow of a signal for making a reservation of an exposure process to the product lot in the exposure apparatus. Another on-line channel 310 shows the flow of a signal for informing the state of operation of each exposure apparatus 306-307, as well as the state of a lot process reservation, described above, to the host unit 301. On the basis of these on-line communications, the host unit 301 can perform centralized control of the exposure apparatuses.

For an exposure process of a product lot, first of all, the operator prepares a recipe corresponding to the type of product by using the host unit 301 and, after naming that recipe, the operator stores it into a recipe database 302. Subsequently, when preparation for processing the product in the exposure apparatus is completed, the operator chooses the stored recipe's name of the product from the recipe database 302 and inputs the recipe's name into the host unit 301 together with the data relevant to the exposure apparatus 307 to be used. In response to the data input, the host unit 301 forwards the recipe data to the designated console unit 304 through the on-line communication channel 309, which is broadband. Then, the console unit 304 inserts the received recipe data at the end of a lot queue 409, to be described below with reference to FIGS. 4 and 5.

Figure 4:
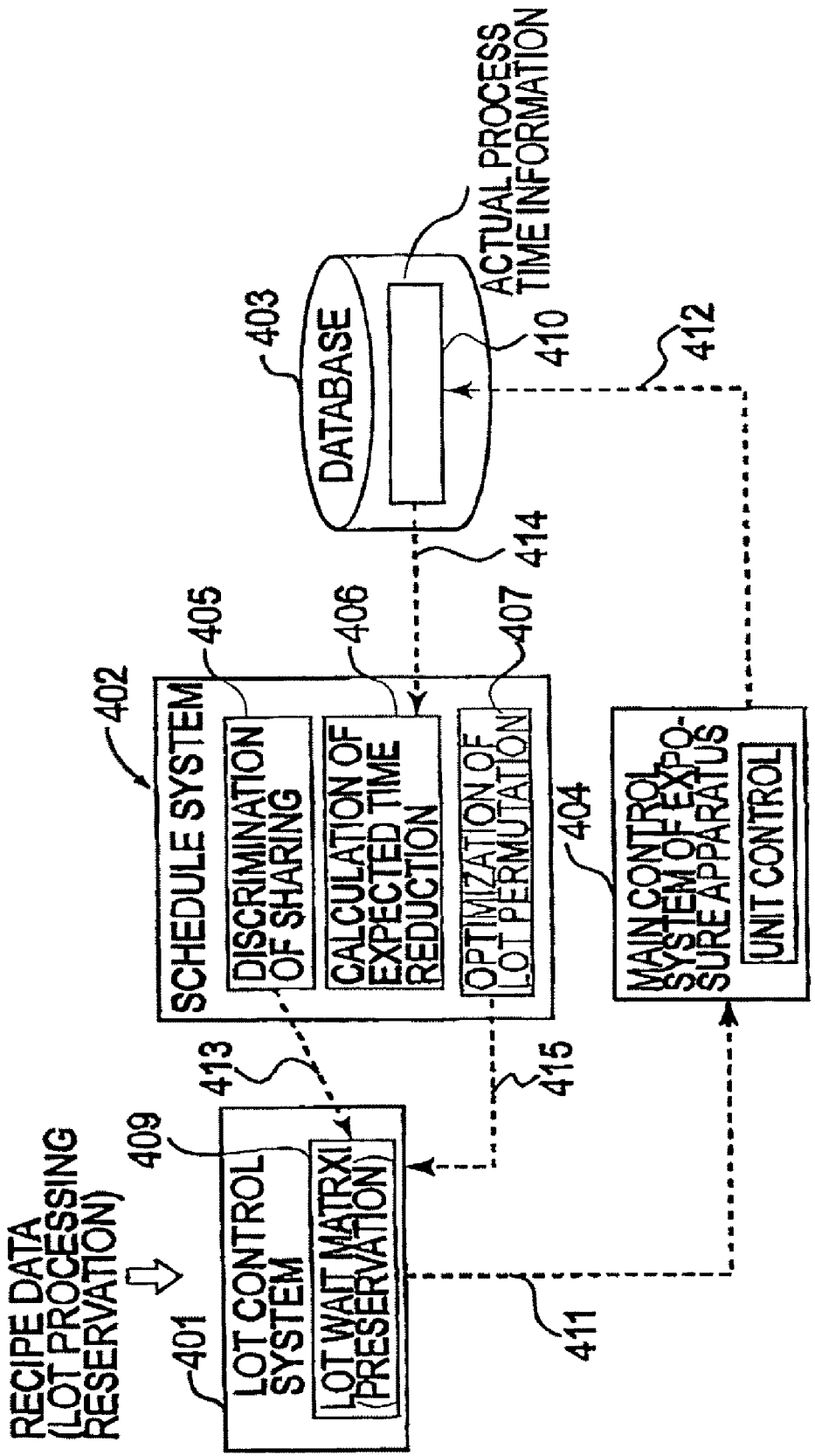
FIG. 4 is a schematic and diagrammatic view of a system structure of a console unit according to an embodiment of the present invention.
Figure 5:
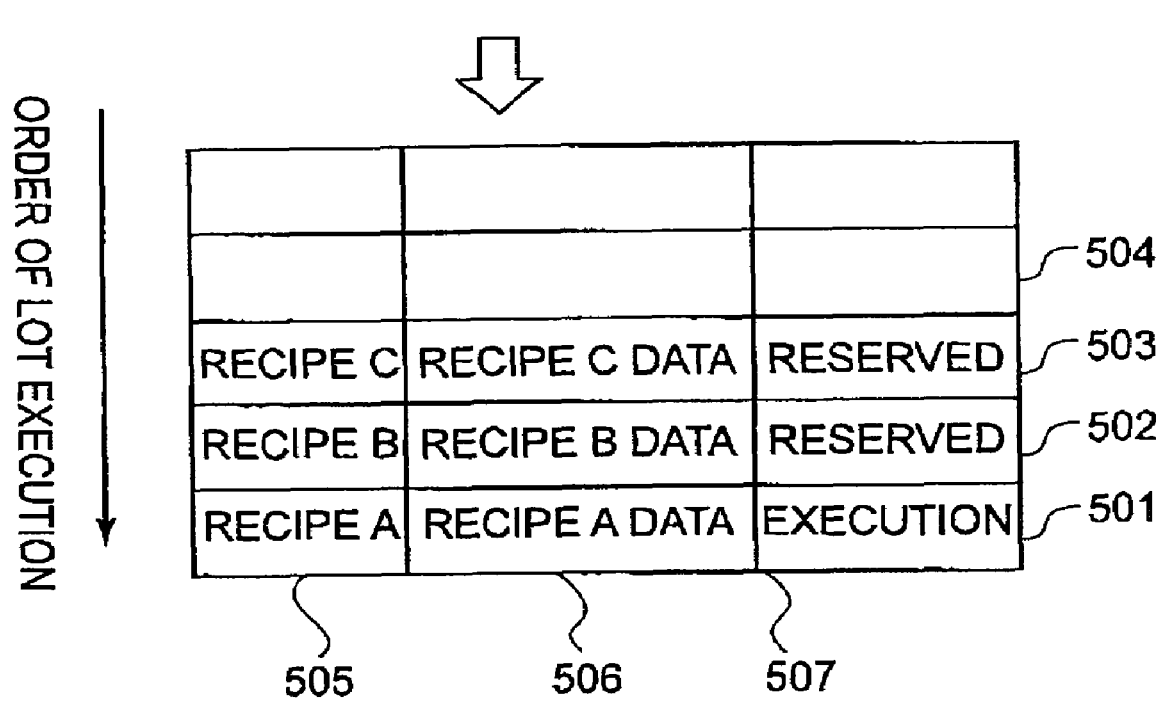
FIG. 5 is a schematic view of a data line to be preserved in a lot queue, according to an embodiment of the present invention.

FIG. 4 illustrates the system structure of a console unit according to this embodiment of the present invention. Broken-line arrows in the drawing show the flow of data. A lot control system 401 functions to preserve the lot queue 409 and it serves as a queuing device for the above-described recipe data of the product lot, for example. FIG. 5 illustrates the logical data structure to be queued into the lot queue 409 of FIG. 4. Here, row 505 shows the recipe's name, row 506 shows the substance of recipe data, and row 507 shows the state of a lot. The state of a lot at row 507 starts with "being reserved" as the same is inserted to the lot queue 409, and it transmits to "being executed" in response to the start of an exposure process. The recipe data is deleted from the lot queue 409 when the exposure process is completed.

FIG. 5 is a case wherein the lot process is instructed in the sequence of recipe A, recipe B and recipe C, and it shows an example wherein recipe A is queued to line 501, recipe B is queued to line 502, and recipe C is queued to line 503, respectively, in this sequence. A recipe data, if any, to be forwarded from the host unit 301 will be inserted at line 504. The lot control system 401 operates to send the recipe data 411 at the leading lot of the lot queue 409 to a main control system 404, and it changes the state of lot at row 507 of that lot from "being reserved" to "being executed".

The main control system 404 having received the recipe data controls the sequence of an exposure process for exposing substrates of a predetermined number, in accordance with the control data of the recipe substance 506. This main control system 404 is the same system as the main control device 103 described hereinbefore with reference to FIG. 1. On the basis of a synchronization signal from the main control device 103, the laser control device 102, the mask stage control device 126 and the wafer stage control device 120 operate synchronously to execute the step-and-scan exposure.

When exposures of substrates of a predetermined number are completed, the main control system 404 informs the completion to the lot control system 401, although it is not shown in the drawing. The lot control system 401 deletes the line 501 in the lot queue 409 and shifts the remaining lot sequence (remaining lines) forward. After this, the exposure process is repeated in a similar manner until all the waiting lots in the lot queue 409 are deleted.

Furthermore, the main control system 404 has a function for actually measuring the process time and for recording the results (412) in the database 403 as actual process time record information 410. The pieces to be recorded in the database as this actual process time record information may include: (i) mask conveyance time necessary for moving a mask 109 out of a mask storing shelf (not shown), called a mask library, onto the mask stage 123 and for completing the positioning of the mask on the mask stage 123; (ii) the time necessary for measuring the illuminance with use of an image plane light-quantity sensor 127 and for calibrating the photosensor 107 (i.e., illuminance offset value measuring time), to compensate for any changes in illuminance to be produced on the image plane due to a difference in illumination condition of the illumination optical system 104; and (iii) the time necessary for measuring the Z-axis position of each detection point on the wafer beforehand by use of surface position detecting means 121 and 122 (i.e., pattern offset value measuring time), to detect an offset value related to the detected value of the surface position detecting means at each detection point on the wafer. These production-preparing process time data may be used when a scheduling system 402 (to be described later) estimates the production time.

The schedule system 402 according to this embodiment functions to compare, in regard to two consecutive recipes, the latter recipe with the former recipe and to omit a production-preparing process or processes in relation to the latter recipe that can be shared with the former recipe. More specifically, while changing the sequence of recipe data queued in the lot queue 409, the schedule system 402 omits any shareable production-preparing process and determines the execution sequence for a plurality of products lots, which is effective to assure the shortest process time. For example, the schedule system 402 may include the following elements (i)-(iii): that is, (i) a discrimination unit 405 for analyzing plural recipe data 413 being queued in the lot queue 409 as instructed, and for discriminating a production-preparing process that can be shared between lots; (ii) an estimation calculation unit 406 for estimating the time to be shortened, on the basis of the result of that discrimination and from the recorded process time 414; (iii) a lot sequence optimization unit 407 for determining (rescheduling) the lot execution sequence on the basis of the saved time, so as to minimize the overall process time for all the lots. The lot sequence 415 determined by the rescheduling, such as described above, is preserved in the lot queue 409.

Referring now to the schematic view of FIG. 6, the discrimination method in the discrimination unit 405 for discriminating a shareable process between lots, will be explained.

Figure 6:
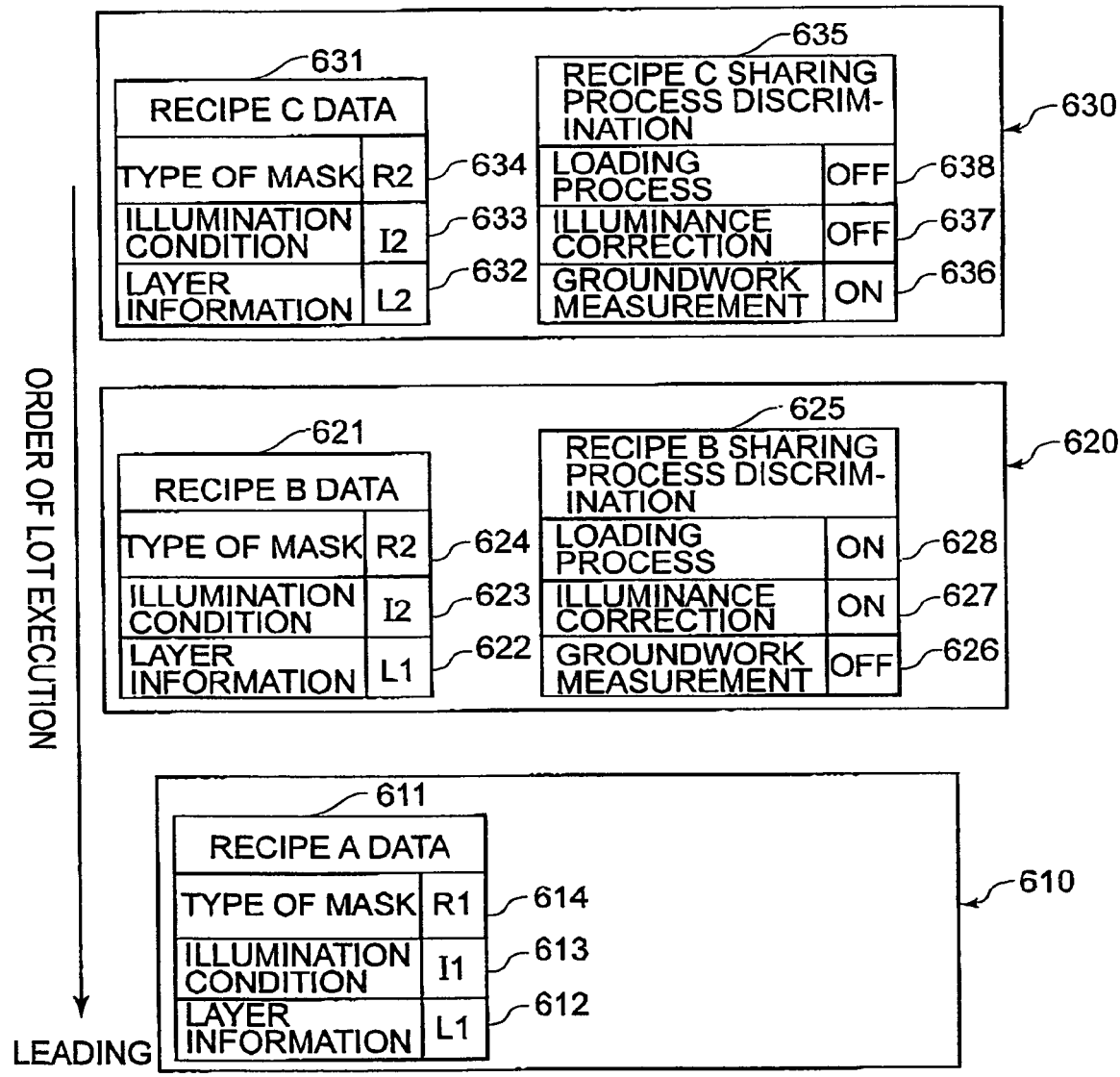
FIG. 6 is a schematic view for explaining the principle of lot-to-lot shareable process discrimination, according to an embodiment of the present invention.

FIG. 6 illustrates the state in which three process commands are being reserved in the lot queue 409, in the sequence of lot A (610), lot B (620) and lot C (630). Regarding these lots 610, 620 and 630, respective recipe data 611, 621 and 631 have been stored. In this embodiment, discrimination of any shareable preparation process is executed on the basis of the type of the mask, the illumination condition and the set value related to the layer information (substrate-ground pattern condition). In this manner, on the basis of the recorded process time measured by the main control system 404, the lot process sequence is determined so as to minimize the overall process time. Furthermore, an omittable process out of the conveyance process and the measurement process is omitted. For example, when the same mask is going to be used for consecutive lots, the mask conveyance process will be unnecessary in a later lot process. On the other hand, when the exposure process is going to be carried out to consecutive lots under the same illumination condition, the illuminance offset value measured with respect to an earlier lot process may be used in succession in later lot processes. If the substrate-ground pattern condition is identical, the pattern offset value measured during an earlier lot process can be used in succession in later lot processes. Therefore, a corresponding measurement process may be omitted in the later lot processes.

First of all, a description will be made of an example wherein the leading lot, i.e., recipe A data 611, is taken as a reference and wherein discrimination is carried out with respect to any process which is shareable with recipe B data 621. In the recipe B data 621, the type of mask at 614 has been set as "R2". Therefore, mask conveyance is necessary in the recipe B process and, thus, at the sharing process discrimination 625 for the recipe B, the conveyance process at 628 is concluded as "to be executed", that is, "ON".

Similarly, the illumination condition at 613 for the reference recipe A data 611 has been set as "I1", whereas the illumination condition at 623 for the recipe B data 621 has been set as "I2". As a result, the offset measurement for illuminance correction at 627 is concluded as "to be executed", that is, "ON". On the other hand, the layer information at 612 for the reference recipe A data 611, which is the substrate-ground pattern condition, has been set as "L1", while the layer information at 622 of the recipe B data 612 as well has been set as "L1". Therefore, the ground measurement (pattern offset measurement) at 626 may be concluded as "to be omitted", that is, "OFF".

Next, the recipe for which sharing process discrimination is to be made is put forward to recipe C data 631. Thus, the recipe B data 621 is taken as a reference, and sharing process discrimination is repeated with regard to the recipe C data 631 sequent to the recipe B data.

The type of mask at 624 and 634 for both of these consecutive lots is identical, i.e., "R2". Therefore, in the recipe C sharing process discrimination at 635, the mask loading process at 638 may be concluded as "to be omitted", that is "OFF". Furthermore, the illumination condition at 623 and 633 is identical, i.e., "I2". Therefore, the offset measurement for illuminance correction at 637 may be concluded as "to be omitted", that is, "OFF". However, the layer information at 622 for the reference recipe B data 621, which is the substrate-ground pattern condition, has been set as "L1", whereas the layer information at 632 for the recipe C data 631 has been set as "L2". Therefore, the ground measurement (pattern offset measurement) at 636 is concluded so as "to be executed", that is, "ON".

On the basis of the results of these sharing process discriminations at 625 and 635, the estimation calculation unit 406 calculates the time to be saved out of the lot process time. In the case of a lot sequence of recipe A, recipe B and recipe C shown in FIG. 6, the mask conveyance process can be omitted once, the illuminance offset value measuring process can be omitted once, and the pattern offset value measuring process can be omitted once. Hence, once the actual process time recorded information 410 having been recorded in the database 403, such as an average of each process time, for example, is acquired, the time that can be shortened in the overall lot sequence can be estimated.

Figure 7:
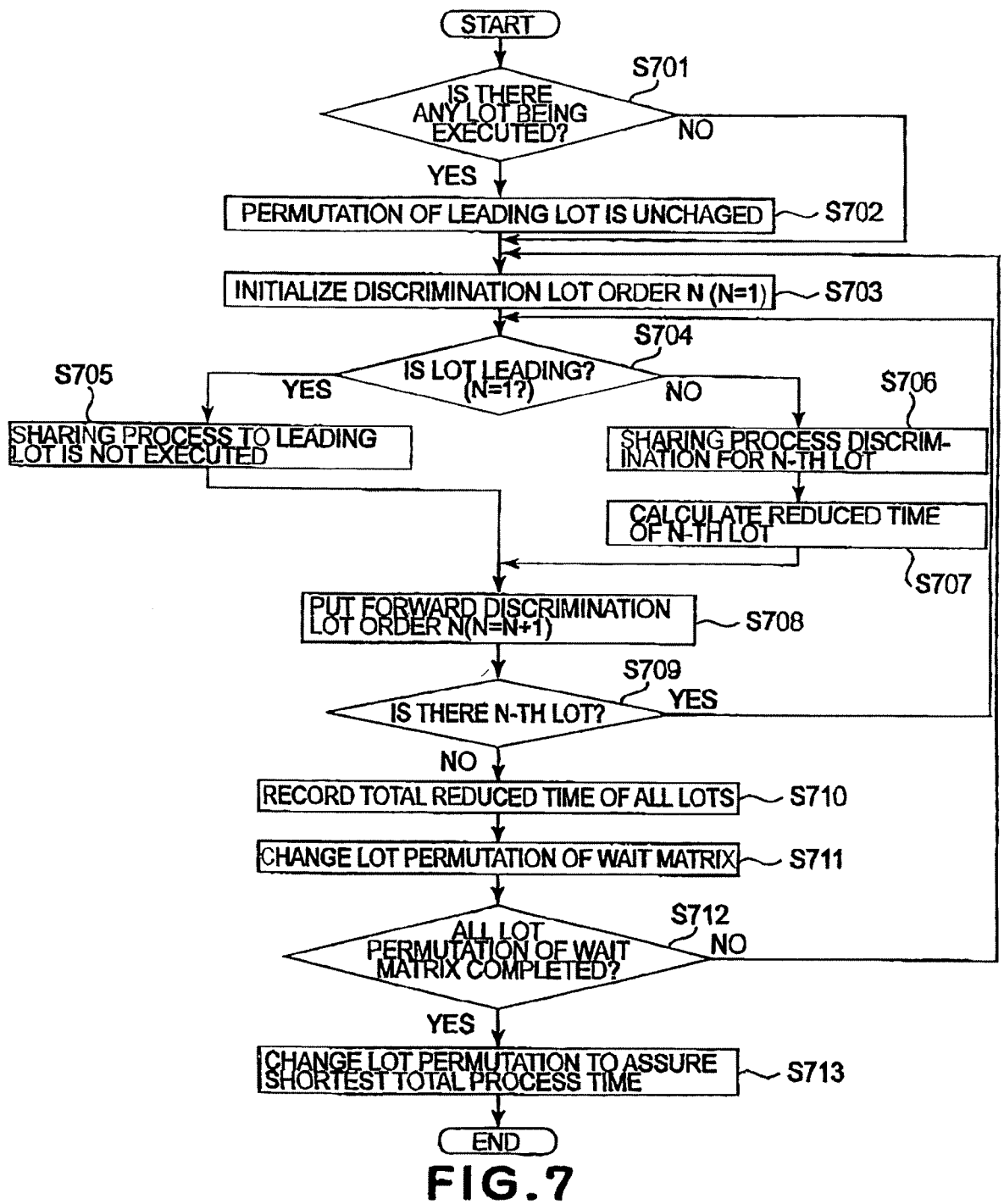
FIG. 7 is a flow chart of a scheduling unit according to an embodiment of the present invention.

Next, the overall procedure of the scheduling system 402 will be explained in conjunction with the flow chart of FIG. 7 as well as the schematic illustrations of the optimization process of FIGS. 8A-8D.

Figure 8A:
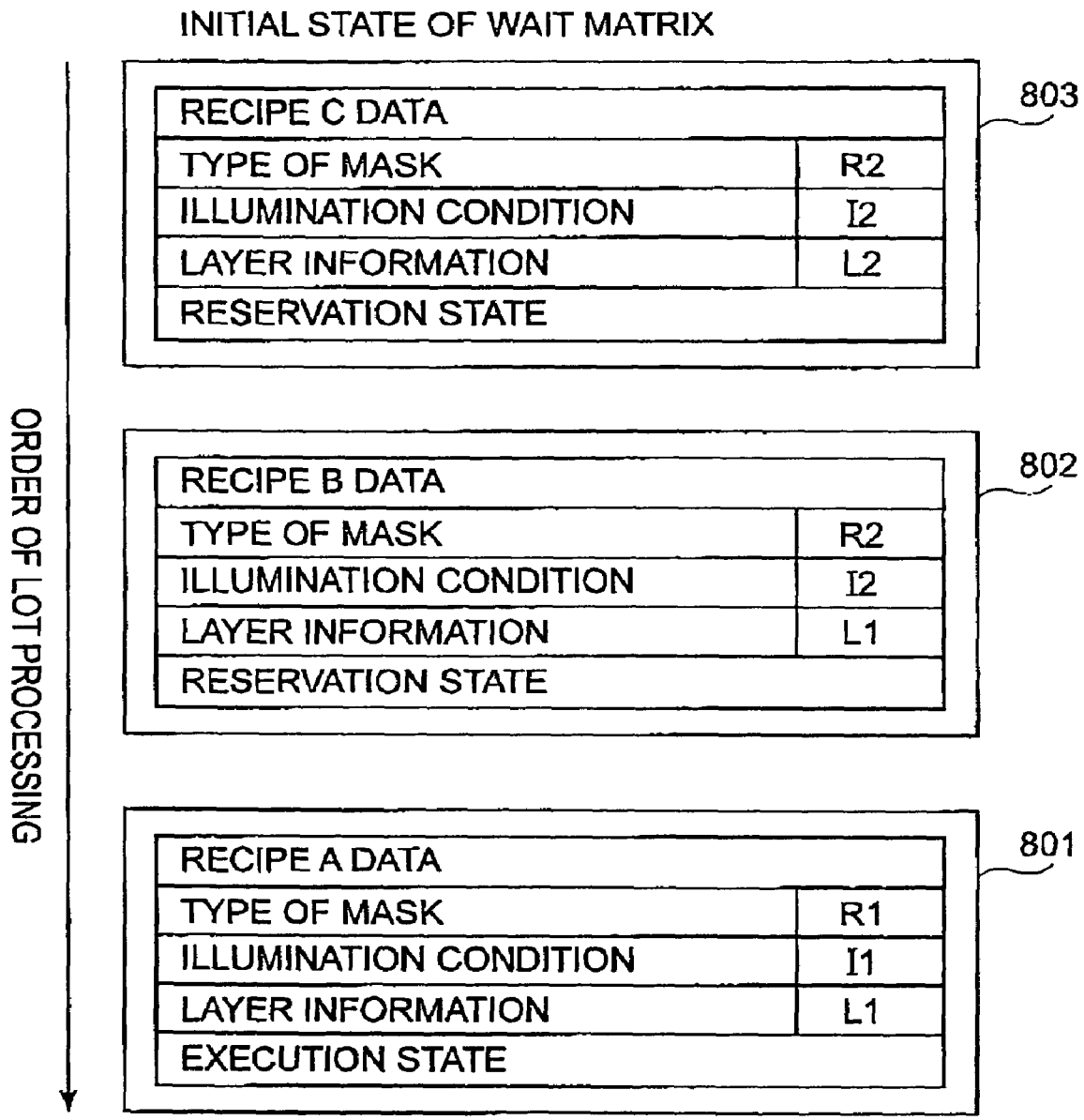

Preferably, the scheduling should be initiated after a lot process is newly reserved. For example, desirably, it may be started automatically in response to a process command applied from the host unit 301 via the communication channel 309. Alternatively, the scheduling may be initiated in response to the operator's direct command to each console unit 303, 304 or 305. Prior to the scheduling, a discrimination is made at step S701 as to whether the leading lot of the lot queue 409 is under execution or not. Only when there is a lot which is being executed, the procedure goes to step S702, and the lot which is being executed is excluded from the subject of execution order change. This is because the order of the lot under execution cannot be relocated. FIG. 8A shows the initial state of the lot queue. In the illustrated example, the leading lot 801 is being executed in the exposure apparatus, and, therefore, this lot is held fixed as the leading lot even in the subsequent lot order changing step at S712.

In this embodiment, sharing process discrimination is carried out to the recipes in the lot queue, in the order of being stored and from the loading head of the execution sequence. To this end, at step S703, the lot sequence variable N to be discriminated is initialized by "1," which means the leading head of the lot queue. Subsequently, at step S704, whether the recipe, which is just going to be discriminated, is that for the leading lot or not is discriminated. This is because, as has been described with reference to FIG. 6, the sharing process discrimination is carried out while taking an earlier recipe data as the reference, and this means that the sharing process discrimination is not made to the leading lot, which has no lot earlier that it. Since the initialization has been done first of all with the leading lot (N=1), the procedure goes to step S705, bypassing the sharing process discrimination.

Figure 8B:
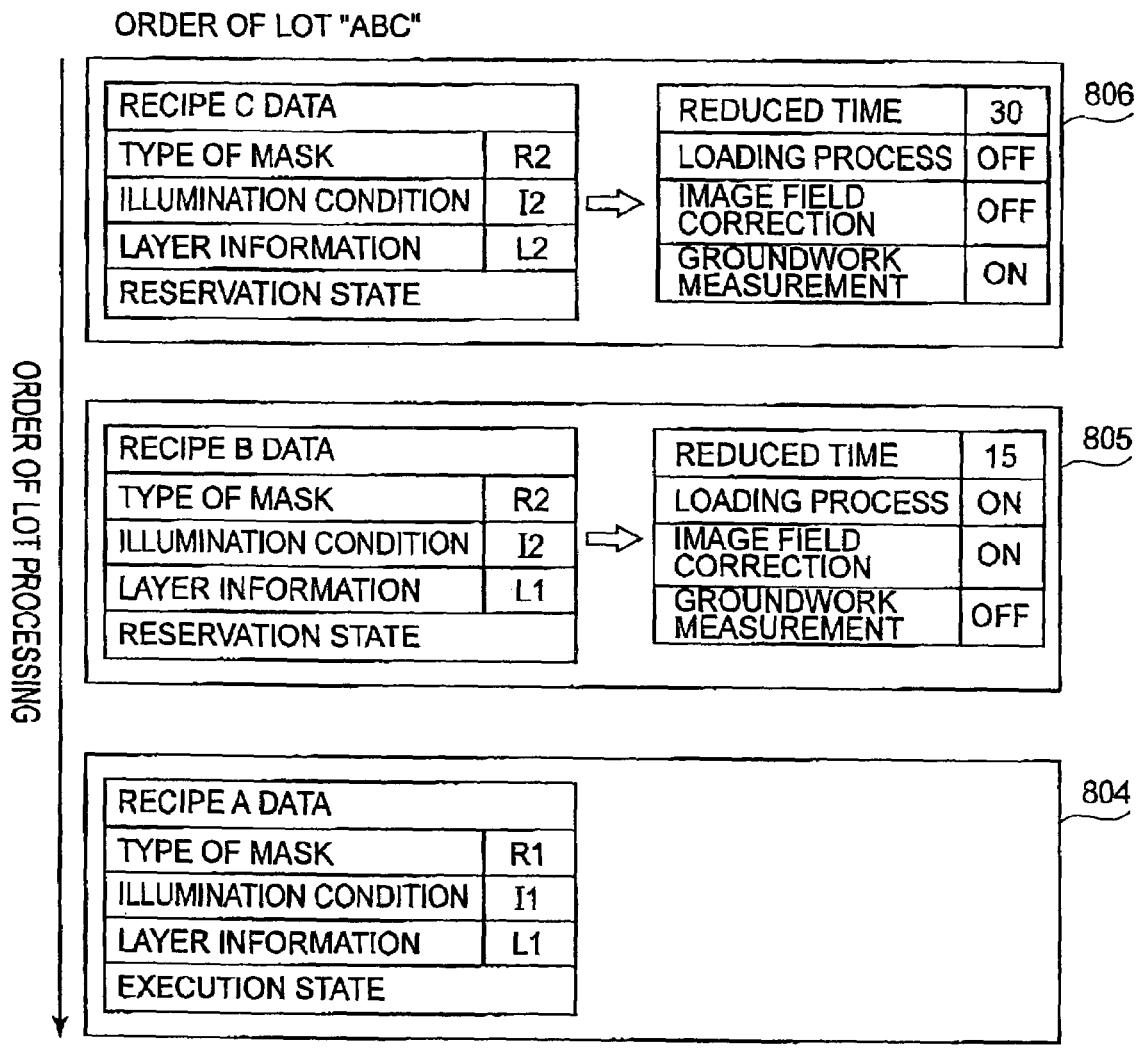

Subsequently, at step S708, the discrimination lot order N is put forward by an increment "1" and, thereafter, the operations at steps S706, S707 and S708 are repeated until, at step S709, all the recipes in the lot queue, which are to be discriminated, are deleted. The operations at steps S706 and S707 correspond to those of the sharing process discrimination unit 405 and the time saving estimation calculation unit 406, respectively, as has been described with reference to FIG. 6. Namely, these are steps for performing discrimination of any process that can be shared by two consecutive lots, more particularly, any process that can be omitted in the latter lot, and for performing estimation calculation for shortening of the lot process time on the basis of the recorded process time, respectively. FIG. 8B schematically illustrates details of this procedure. In FIG. 8B, comparing recipe A data 804 for the first lot and recipe B data 805 for the second lot, it is seen that in both of them the layer information (substrate-ground pattern condition) is "L1". Since the condition is identical, the ground pattern measuring process in the second lot (later lot) may be designated as "to be omitted", that is, "OFF". From the actual process time recorded information 410, it can be estimated that the omission of the ground pattern measurement provides shortening of the process time by fifteen seconds, for example. Subsequently, comparing recipe B data 805 for the second lot and recipe C data 806 for the third lot, it is seen that in both of them the type of the reticle is "R2". Since the condition is identical, the mask loading process for the third lot may be designated as "to be omitted", that is, "OFF". Furthermore, in both of them, the illumination condition is "I2" and, since the condition is identical, the illuminance offset value measuring process for the third lot may be designated as "to be omitted", that is, "OFF".

From the process time recorded information 410, it can be estimated when the omission of these processes provides shortening of the process time for the third lot by, for example, twenty seconds in the mask loading process and ten seconds in the illuminance offset value measuring process, that is, by thirty seconds in total. After the process for a single lot execution sequence is completed, the procedure goes to step S710 and the expected total shortening of time to be provided when all the lots are executed successively is calculated and recorded. The expected shortening of time obtainable with the execution sequence of FIG. 8B is forty-five seconds.

Figure 8C:
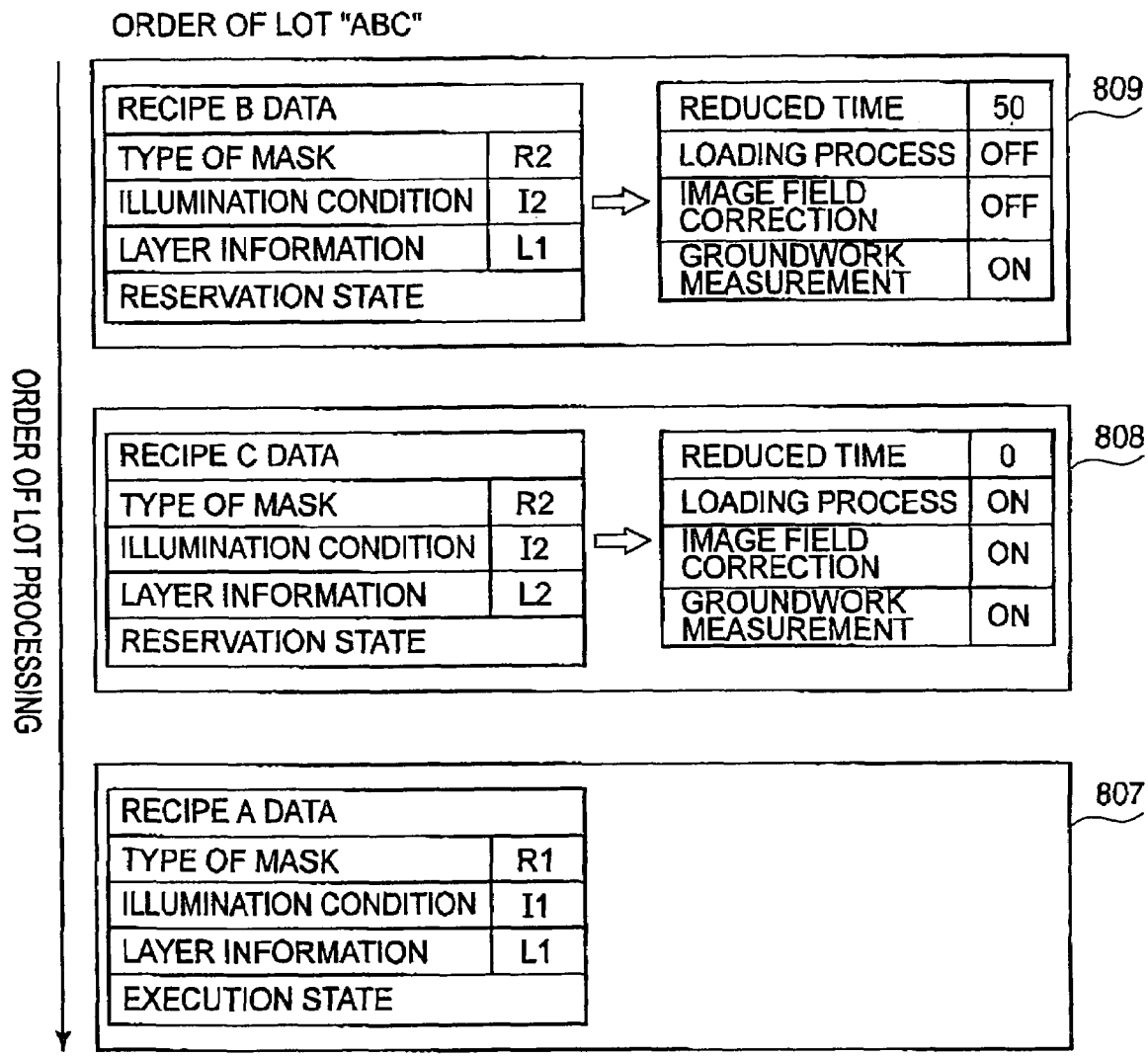

Subsequently, at step S711, the lot execution sequence is changed. FIG. 8C shows an execution sequence wherein the processing order of the recipe B data 809 and the recipe C data 808 is reversed, while the recipe A data 807, which is being executed, is held fixed. In regard to this lot sequence as well, similarly to what has been described with reference to FIG. 8B, the operations at step S706, S707 and S708 are repeated until all the recipes in the lot queue, which are to be discriminated, are deleted.

In the example of FIG. 8C, first of all, the recipe A data 807 of the first lot and the recipe C data 808 of the second lot are compared with each other. Since, however, there is no identical condition, no process can be omitted. Hence, the discrimination lot is put forward by one, and the recipe C data 808 of the second lot and the recipe B data 809 of the third lot are compared with each other. In this case, the type of the mask and the illumination condition are identical. Thus, shortening of the time by twenty seconds for the mask loading process and ten seconds for the illuminance offset value measuring process, that is, by thirty seconds in total, can be estimated. Hence, in regard to this execution sequence, the expected shortening of time is thirty seconds.

At step S712, whether the processing for all the lot execution sequences has been completed or not is discriminated. If it has been completed, at step S713, one execution sequence for product lots that can minimize the process time is chosen out of all the lot execution sequences. In the example of FIGS. 8A-8C, the execution sequences of FIGS. 8B and 8C are compared with each other, and the execution sequence of FIG. 8B for which a shorter process time is expected is chosen. Then, the lot queue 409 is renewed. FIG. 8D shows the thus determined lot queue. If there are plural lot execution sequences having identical expected shortenings of time, one of them may be chosen and determined by the operator.

Although the process time recorded information 410 has been explained as an average process time of each preparation process, this is merely for convenience in explanation and it is not limited to the described example. Furthermore, the actual process time should preferably be recorded while subdividing the same with respect to several operational parameters. For example, regarding the mask conveyance time, a plurality of conveyance-start-position parameters may be prepared and, with respect to each of these conveyance starting positions, the actual time until the mask is positioned upon the mask stage may be measured and recorded. For measurement of the ground pattern (pattern offset value), number-of-measurement-point parameters may be prepared so that, with respect to each number of measurement points, the actual time of the measuring process may be measured and recorded. By measuring and recording the actual time with respect to each operation parameter as described above and by estimating the process time on the basis of it, the estimation precision can be improved significantly and, as a consequence, the productivity can be raised.

Furthermore, in this embodiment, the main control system 404 of the exposure apparatus operates, for the lot processing, to record the actual time of each production preparation process into the database 412 and, by using an averaged actual recorded time, it estimates the shortening of the process time. However, the estimation of the time shortening is not limited to this. For example, in the sense of reflecting any change of the processing capacity of the exposure apparatus, a difference between the actual recorded time and the estimated time may be preserved as an offset value and, by adding this offset value to the latest estimated-time, a new estimated-time may be determined.

Embodiment 2

Next, as a second embodiment of the present invention, an embodiment of a semiconductor device manufacturing method, which uses an exposure apparatus according to the first embodiment, will be explained.

Figure 9:
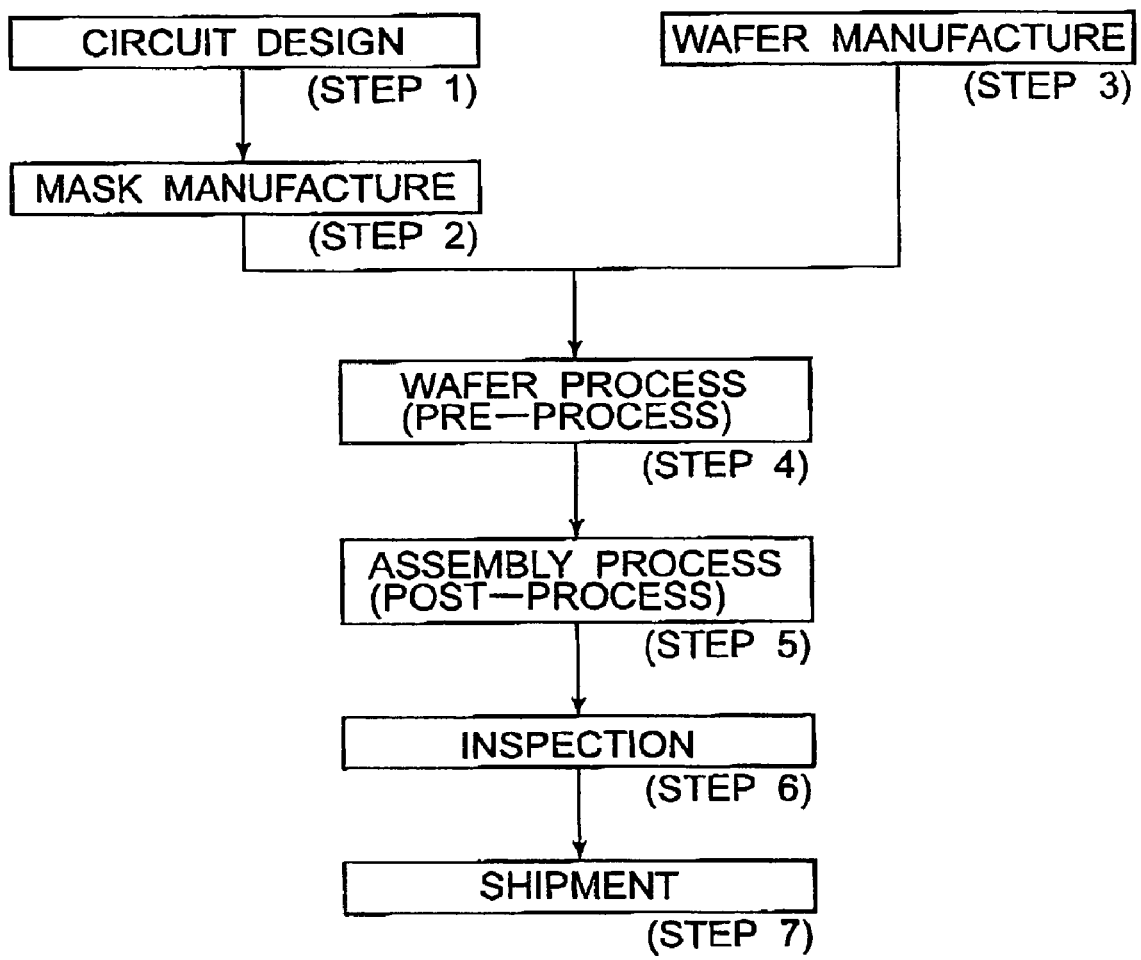
FIG. 9 is a flow chart for explaining an overall procedure of semiconductor device manufacture.

FIG. 9 is a flow chart for explaining the overall procedure for semiconductor device manufacture. Step 1 is a design process for designing a circuit of a semiconductor device. Step 2 is a process for making a mask on the basis of the circuit pattern design.

On the other hand, step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With these processes, semiconductor devices are produced, and they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for exposing a plurality of lots of substrates to light, said apparatus comprising:

a designating unit for designating, on the basis of an exposure condition being related to two consecutive lots of the plurality of lots of substrates and being reserved in said apparatus, an exposure preparation process being related to the latter one of the two consecutive lots and going to be omitted;

an estimating unit for estimating a process time to be saved by the omission of the exposure preparation process designated by said designating unit; and a generating unit for generating a sequence for the plurality of lots, on the basis of the estimation made by said estimating unit, so as to minimize a required process time.

2. An apparatus according to claim 1, further comprising a timer unit for measuring a time taken for the exposure preparation process, and a recording unit for recording data related to the time measured by said timer unit, wherein said estimating unit estimates the process time on the basis of the data recorded by said recording unit.

3. An apparatus according to claim 1, wherein, on a condition that a particular exposure condition related to the two consecutive lots is the same for both of the two consecutive lots, said designating unit designates an exposure preparation process concerning that particular exposure condition as the exposure preparation process to be omitted.

4. An apparatus according to claim 3, wherein the particular exposure condition relates to a type of an original, and said designating unit designates a conveyance process for the original as the exposure preparation process to be omitted.

5. An apparatus according to claim 3, further comprising an illuminance measuring system, wherein the particular exposure condition relates to an illumination condition for an original, and said designating unit designates a calibration process for said illuminance measuring system under the illuminance condition as the exposure preparation process to be omitted.

6. An apparatus according to claim 3, further comprising a focus measuring system for measuring a surface position of the substrate for focusing of the substrate, wherein the particular exposure condition relates to a kind of a pattern already formed on the substrate, and said designating unit designates an offset value measuring process for said focus measuring system as the exposure preparation process to be omitted.

7. A device manufacturing method, comprising steps of:

exposing a substrate to light by use of an apparatus as recited in claim 1;

developing the exposed substrate; and processing the developed substrate to produce a device.

8. A method of generating a sequence for a plurality of lots of substrates to be exposed, said method comprising steps of:

designating, on the basis of an exposure condition being related to two consecutive lots of the plurality of lots of substrates, an exposure preparation process being related to the latter one of the two consecutive lots and going to be omitted;

estimating a process time to be saved by the omission of the exposure preparation process designated in said designating step; and generating a sequence for the plurality of lots on the basis of the estimation made in said estimating step, so as to minimize a required process time.

9. A method according to claim 8, wherein, in said estimating step, the process time is estimated on the basis of data related to a time actually taken for the exposure preparation process.

10. A method according to claim 8, wherein, on a condition that a particular exposure condition related to the two consecutive lots is the same for both of the two consecutive lots, in said designating step, an exposure preparation process concerning that particular exposure condition is designated as the exposure preparation process to be omitted.

11. A method according to claim 10, wherein the particular exposure condition relates to a type of an original, and, in said designating step, a conveyance process for the original is designated as the exposure preparation process to omitted.

12. A method according to claim 10, wherein the particular exposure condition relates to an illumination condition for an original, and, in said designating step, a calibration process for the illumination measuring system under the illumination condition is designated as the exposure preparation process to be omitted.

13. A method according to claim 10, wherein the particular exposure condition relates to a type of a pattern already formed on the substrate, and, in said designating step, an offset value measuring process for a focus measuring system for measuring a surface position of the substrate for focusing of the substrate is designated as the exposure preparation process to be omitted.

* * * * *

UNITED STATES PATENT AND TRADEMARK OFFICE
CERTIFICATE OF CORRECTION

PATENT NO. : 7,257,453 B2 Page 1 of 1
APPLICATION NO. : 11/244280
DATED : August 14, 2007
INVENTOR(S) : Hiromi Kemmoku It is certified that error appears in the above-identified patent and that said Letters Patent is hereby corrected as shown below:

COLUMN 2:
 Line 57, "embodiment." should read -- invention. --.

COLUMN 3:
 Line 7, "flow chart" should read -- flowchart --.
 Line 12, "flow chart" should read -- flowchart --.

COLUMN 8:
 Line 36, "sequent" should read -- subsequent --.
 Line 65, "flow chart" should read -- flowchart --.

COLUMN 11:
 Line 14, "estimated-time," should read -- estimated time, --.
 Line 15, "estimated-time" should read -- estimated time --.
 Line 23, "flow chart" should read -- flowchart.--.

COLUMN 13:
 Line 15, "omitted." should read -- be omitted. --.

Signed and Sealed this

Twentieth Day of May, 2008

JON W. DUDAS
*Director of the United States Patent and Trademark Office*